United States Patent
Iwai et al.

(10) Patent No.: US 11,592,347 B2
(45) Date of Patent: Feb. 28, 2023

(54) RESONANT PRESSURE SENSOR WITH IMPORVED LINEARITY

(71) Applicant: YOKOGAWA ELECTRIC CORPORATION, Tokyo (JP)

(72) Inventors: Shigeto Iwai, Tokyo (JP); Atsushi Yumoto, Tokyo (JP); Makoto Noro, Tokyo (JP); Takashi Yoshida, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/854,209

(22) Filed: Jun. 30, 2022

(65) Prior Publication Data

US 2022/0349766 A1    Nov. 3, 2022

Related U.S. Application Data

(63) Continuation of application No. 17/143,517, filed on Jan. 7, 2021, now Pat. No. 11,428,594.

(30) Foreign Application Priority Data

Jan. 10, 2020   (JP) .............................. JP2020-002784

(51) Int. Cl.
   *G01L 9/00*      (2006.01)
(52) U.S. Cl.
   CPC .................. *G01L 9/0072* (2013.01)
(58) Field of Classification Search
   None
   See application file for complete search history.

(56) References Cited

U.S. PATENT DOCUMENTS

| 5,747,705 A | * | 5/1998 | Herb | ...................... G01L 9/0019 |
| | | | | 73/862.59 |
| 9,157,821 B2 | * | 10/2015 | Robert | .................... G01L 9/001 |

(Continued)

FOREIGN PATENT DOCUMENTS

| CN | 102288516 A | 12/2011 |
| CN | 102297741 A | 12/2011 |

(Continued)

OTHER PUBLICATIONS

Office Action issued in corresponding Chinese Application No. 202110024926.4 mailed Aug. 3, 2022 (17 pages).

*Primary Examiner* — Brandi N Hopkins
*Assistant Examiner* — Nigel H Plumb
(74) *Attorney, Agent, or Firm* — Osha Bergman Watanabe & Burton LLP

(57) ABSTRACT

A resonant pressure sensor with improved linearity includes a substrate including a substrate-fixed portion fixed to a housing-fixed portion and a substrate-separated portion separated from the housing-fixed portion in a first direction; a first resonator disposed in the substrate-separated portion to detect a change of a resonance frequency based on a strain caused by static pressure applied by a pressure-receiving fluid interposed in a gap between the housing-fixed portion and the substrate; a first electrode extending along a second direction to output an excitation signal to the first resonator; a second electrode that extends along the second direction and from which the first resonator outputs a signal having the resonance frequency; and a processor that measures the static pressure based on the detected change.

19 Claims, 9 Drawing Sheets

(56) References Cited

U.S. PATENT DOCUMENTS

2015/0042208 A1   2/2015  Yoshida et al.
2016/0302729 A1*  10/2016 Starr .................. A61M 60/531

FOREIGN PATENT DOCUMENTS

| CN | 103439032 A  | 12/2013 |
| CN | 104344921 A  | 2/2015  |
| CN | 107894297 A  | 4/2018  |
| JP | 2000055931 A | 2/2000  |
| JP | 2004077428 A | 3/2004  |
| JP | 2012058127 A | 3/2012  |
| JP | 2012132806 A | 7/2012  |
| WO | 2013132842 A1| 9/2013  |

* cited by examiner

RESONANT PRESSURE SENSOR WITH IMPORVED LINEARITY

BACKGROUND

Technical Field

The present invention relates to a resonant pressure sensor.

Related Art

For example, resonant pressure sensors conventionally adopt a configuration of measuring pressure by receiving a pressure of a fluid or the like that is a measurement target by a diaphragm and detecting a change in a resonance frequency of a resonator, disposed on a surface of the sensor, caused by a strain arising in the resonator (for example, see patent literature 1 and non-patent literature 1).

Furthermore, when measuring an absolute pressure of the fluid or the like, a pressure reference chamber regulated to a predetermined pressure value needs to be disposed on one side of the diaphragm, and the pressure of the fluid or the like that is the measurement target needs to be applied on another side of the diaphragm.

PATENT LITERATURE

Patent Literature 1 JP 5158160 B2

NON-PATENT LITERATURE

Non-Patent Literature 1 Sensors and Actuators, "Three-dimensional Micromachining of Silicon Pressure Sensor Integrates Resonant Strain Gauge on Diaphragm", Physical Volume 21, Issues 1-3, p 146-150 (February 1990)

In the prior art taught in non-patent literature 1, when a high static pressure is applied to a diaphragm, a peripheral portion thereof deforms. This mitigates stress arising in the diaphragm itself. That is, a resonant pressure sensor generates a so-called balloon effect, wherein a sensitivity when a static pressure is high appears to be lower than a sensitivity when a static pressure is low, and therefore has an issue wherein a linearity of input and output characteristics as a pressure sensor is remarkably degraded. Therefore, it has an issue wherein high measurement precision is difficult to obtain in, for example, uses wherein a high static pressure is applied.

SUMMARY

One or more embodiments provide a resonant pressure sensor that provides high linearity, regardless of a magnitude of a static pressure applied by a fluid or the like that is a measurement target, and includes excellent measurement precision.

A resonant pressure sensor according to one or more embodiments is a resonant pressure sensor, provided with: a pressure sensing unit that can detect a static pressure based on a change value of a resonance frequency; wherein the pressure sensing unit includes a housing-fixed portion that is fixed to a housing; a substrate portion (i.e., substrate) that has a substrate-fixed portion, in at least one location or more, which is fixed to the housing-fixed portion, and a substrate-separated portion, which is separated from the housing-fixed portion and extends from the substrate-fixed portion; a pressure-receiving fluid that is interposed in a gap between the housing-fixed portion and the substrate portion and envelops the substrate portion; and a first resonator that is disposed in the substrate-separated portion and detects as a change value of a resonance frequency based on a strain arising in the substrate portion according to a static pressure applied by the pressure-receiving fluid.

Furthermore, a characteristic feature of the resonant pressure sensor according to one or more embodiments is that in the above configuration, the substrate portion has a cantilever structure whose support point is the substrate-fixed portion.

Furthermore, a characteristic feature of the resonant pressure sensor according to one or more embodiments is that in the above configuration, the substrate portion has a strain-mitigating hole provided so as to penetrate the substrate portion.

Furthermore, a characteristic feature of the resonant pressure sensor according to one or more embodiments is that in the above configuration, the first resonator is made of a semiconductor material including an impurity, a concentration of the impurity is $1 \times 10^{20}$ ($cm^3$) or higher, and an atomic radius of the impurity is smaller than an atomic radius of the semiconductor material, which is a base material.

Furthermore, a characteristic feature of the resonant pressure sensor according to one or more embodiments is that in the above configuration, the pressure sensing unit includes a second resonator that is disposed in the substrate-separated portion of the substrate portion and detects as a change value of a resonance frequency based on the strain arising in the substrate portion according to the static pressure applied by the pressure-receiving fluid, and the second resonator has a pressure sensitivity of the resonance frequency that differs from a pressure sensitivity of the resonance frequency of the first resonator.

Furthermore, a characteristic feature of the resonant pressure sensor according to one or more embodiments is that in the above configuration, the pressure sensing unit has at least two or more substrate-separated portions provided to one substrate portion or a plurality of substrate portions, and the first resonator and the second resonator are respectively disposed in different substrate-separated portions.

Furthermore, a characteristic feature of the resonant pressure sensor according to one or more embodiments is that in the above configuration, both the first resonator and the second resonator are made of a single-crystal silicon material including an impurity, respective concentrations of the impurity in the first resonator and the second resonator being values that differ by at least one order of magnitude or more when a unit is made to be ($cm^{-3}$), and a temperature coefficient of the resonance frequency of the second resonator is greater than a temperature coefficient of the resonance frequency of the first resonator.

Furthermore, a characteristic feature of the resonant pressure sensor according to one or more embodiments is that in the above configuration, a thickness dimension of the second resonator along a thickness direction of the substrate portion is greater than a thickness dimension of the first resonator.

Furthermore, a characteristic feature of the resonant pressure sensor according to one or more embodiments is that in the above configuration, the substrate portion has a base substrate, which has the substrate-fixed portion and is fixed to the housing-fixed portion, and a support substrate, which is connected to the base substrate; the support substrate has a fixed portion, which is fixed to the base substrate, and a separated portion, which is separated from the base substrate and extends from the fixed portion; and the pressure-receiving fluid is interposed in a gap between the base substrate and the support substrate and envelops the separated portion.

According to the resonant pressure sensor according to one or more embodiments of the present invention, a configuration is adopted wherein the substrate portion and the first resonator are provided. The substrate portion has the substrate-fixed portion, in at least one location or more, that is fixed to the housing-fixed portion. It also has the substrate-separated portion. The first resonator is disposed in the substrate-separated portion of the substrate portion. Moreover, it detects as the change value of the resonance frequency based on the strain arising according to the static pressure applied to the substrate portion by the pressure-receiving fluid. By this, high linearity is obtained regardless of a magnitude of a static pressure applied by a fluid or the like that is a measurement target, and excellent measurement precision can be realized.

BRIEF DESCRIPTION OF THE DRAWINGS

FIG. 1A is a sectional view illustrating an overall configuration of the resonant pressure sensor when a liquid is used as a pressure-receiving fluid, and FIG. 1B is a sectional view illustrating the overall configuration of the resonant pressure sensor when air (the atmosphere) is used as the pressure-receiving fluid.

DETAILED DESCRIPTION

Figure 1A:
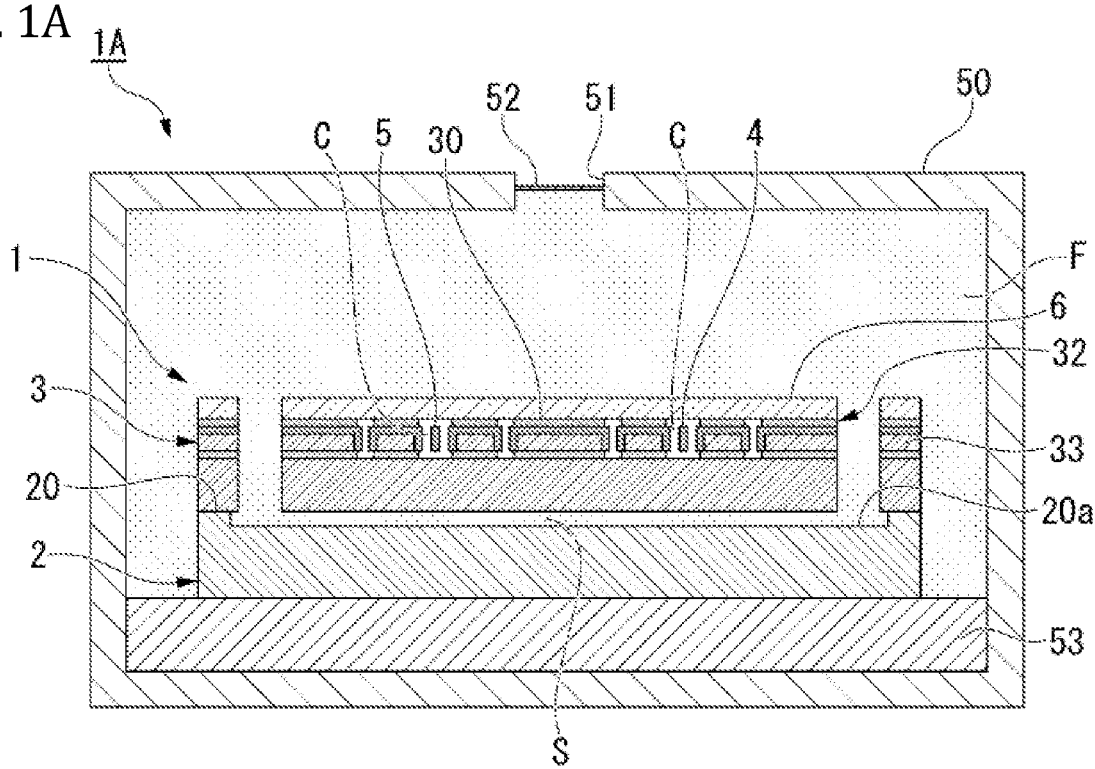
FIGS. 1A and 1B are diagrams for schematically describing a resonant pressure sensor that is a first embodiment.

Embodiments of the present invention will be described herein with reference to the drawings. Those skilled in the art will recognize that many alternative embodiments can be accomplished using the teaching of the present invention and that the present invention is not limited to the embodiments illustrated herein for explanatory purposes.

Resonant pressure sensors according to one or more embodiments are described below while referring to FIGS. 1A-1B to FIG. 12 as appropriate.

The following description first describes a summary of a resonant pressure sensor according to one or more embodiments of the present invention and then details the resonant pressure sensors that are embodiments of first to fifth embodiments. Here, the resonant pressure sensors of the one or more embodiments of the present invention are, for example, ones whereby high measurement precision is obtained in a use wherein a particularly high static pressure is applied.

In the following description, as necessary, positional relationships between members are described while referring to the XYZ orthogonal coordinate system illustrated in the diagrams (the position of the origin being changed as appropriate).

The resonant pressure sensor according to one or more embodiments includes a substrate portion and a first resonator. The substrate portion has a substrate-fixed portion, in at least one location or more, that is fixed to a housing-fixed portion. The substrate portion also has a substrate-separated portion. The first resonator is disposed in the substrate-separated portion of the substrate portion. Moreover, a resonance frequency of the first resonator changes based on a strain that arises according to a static pressure applied to the substrate portion by a pressure-receiving fluid.

In the above basic configuration of one or more embodiments, a pressure (static pressure) of a surrounding environment (fluid) of the resonant pressure sensor, which is a measurement target, is propagated to the pressure-receiving fluid by a pressure-propagating partition-wall member, and the pressure of this pressure-receiving fluid being applied to the substrate portion isotropically compresses the substrate portion. This applies an isotropically compressive stress to the substrate-separated portion but applies a longitudinally compressive stress to the first resonator. As a result, the resonance frequency of the first resonator changes. The resonant pressure sensor according to one or more embodiments measures the static pressure applied to the resonant pressure sensor by measuring this resonance frequency.

In a case of measuring the atmosphere, there may be a situation wherein the above pressure-propagating partition-wall member is not used. In this situation, the pressure-receiving fluid is the "atmosphere" itself.

When using the pressure-propagating partition-wall member as a diaphragm between the pressure-receiving fluid and the atmosphere, for example, a material that is not easily affected by humidity or a material that is not easily affected by wind is used.

Meanwhile, in a resonant pressure sensor of a conventional configuration, as above, a linearity of input and output characteristics as a pressure sensor when a high static pressure is applied is degraded due to the balloon effect compared to input and output characteristics as a pressure sensor when a low static pressure is applied. As such, there are issues such as high measurement precision not being obtained.

In contrast, in the resonant pressure sensor according to one or more embodiments, even when measuring a high static pressure, as above, a support substrate is compressed by an isotropic pressure via the pressure-receiving fluid. As such, the balloon effect that remarkably degrades a linearity of input and output characteristics is avoided in principle. This enables high linearity to be obtained for input and output characteristics as a pressure sensor under a wide range of static pressures regardless of a magnitude of the static pressure applied by the fluid or the like that is the measurement target, and excellent measurement precision can be realized.

First Embodiment

The resonant pressure sensor of the first embodiment is detailed below while referring to FIGS. 1A-1B to FIG. 5.

Figure 1B:
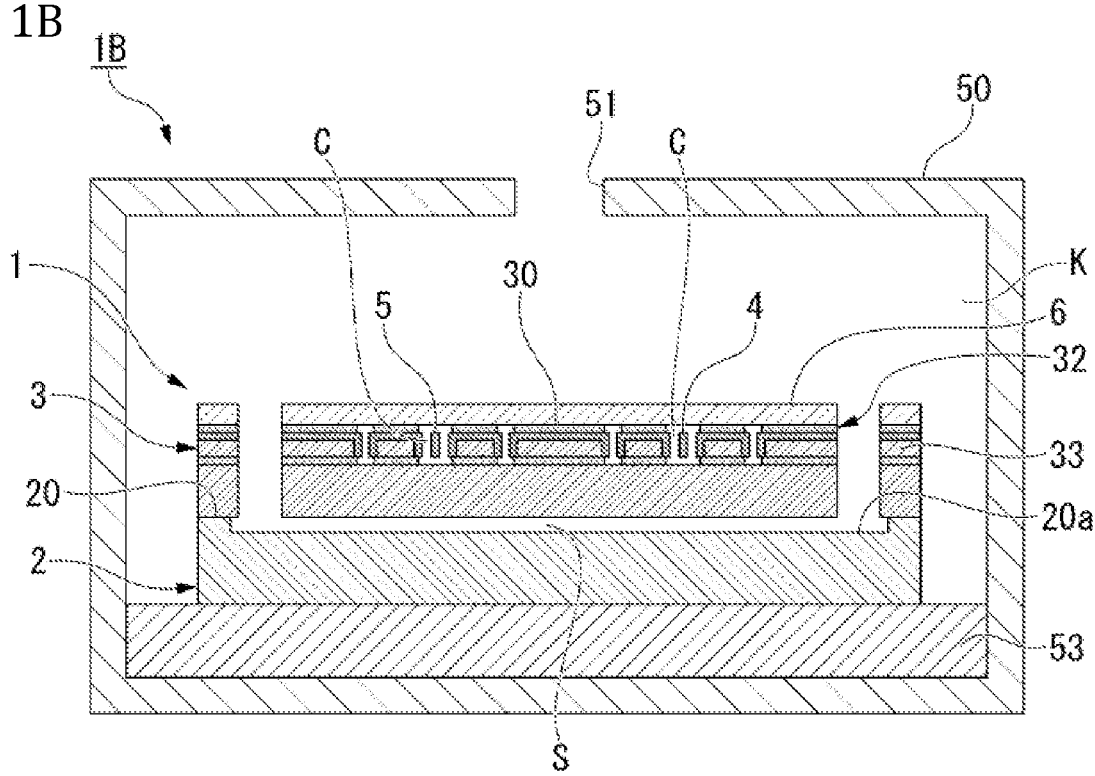
Figure 2:
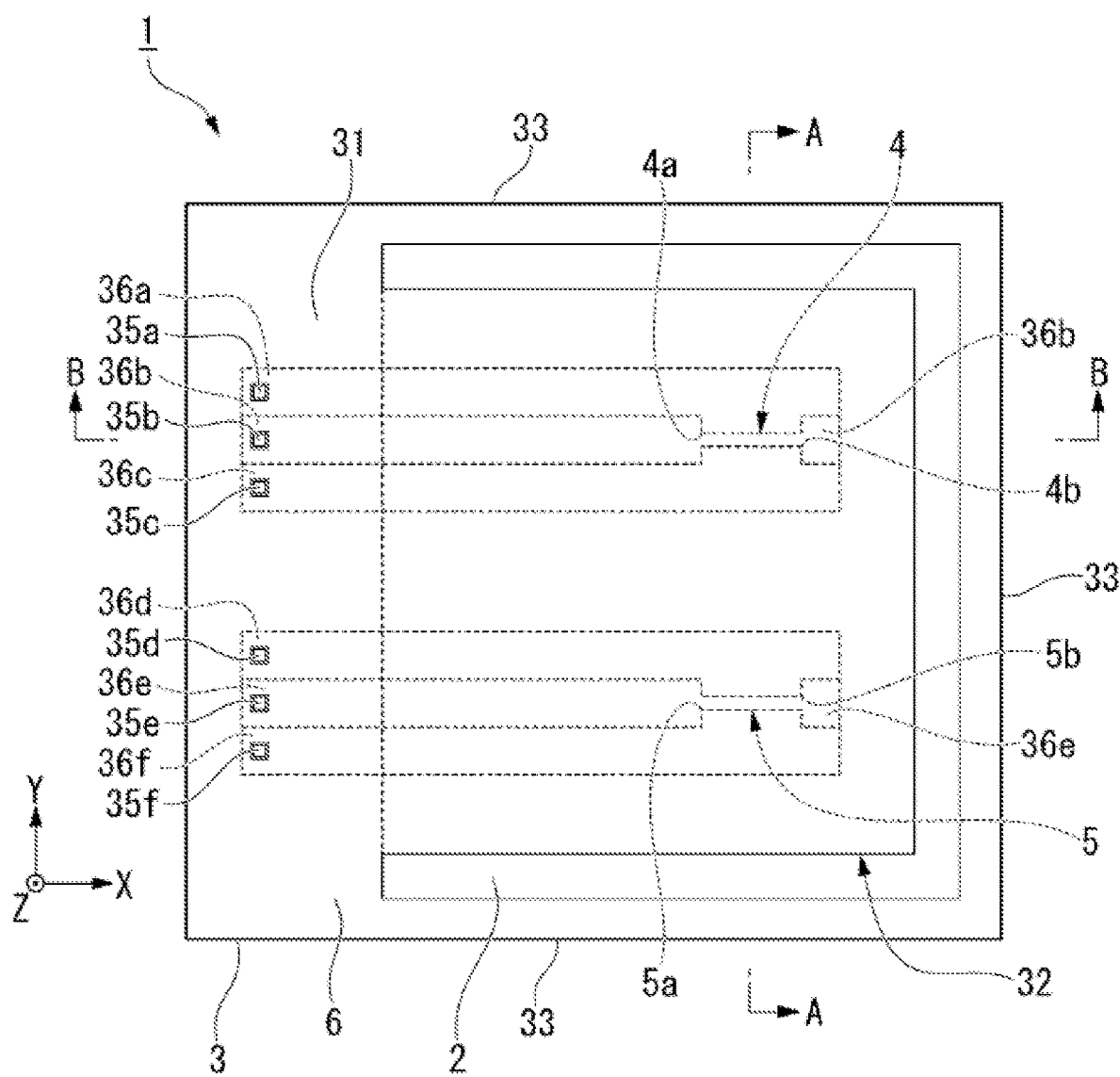
FIG. 2 is a diagram for schematically describing the resonant pressure sensor that is the first embodiment; a plan view of the pressure sensing unit illustrated in in FIGS. 1A-1B.
Figure 3:
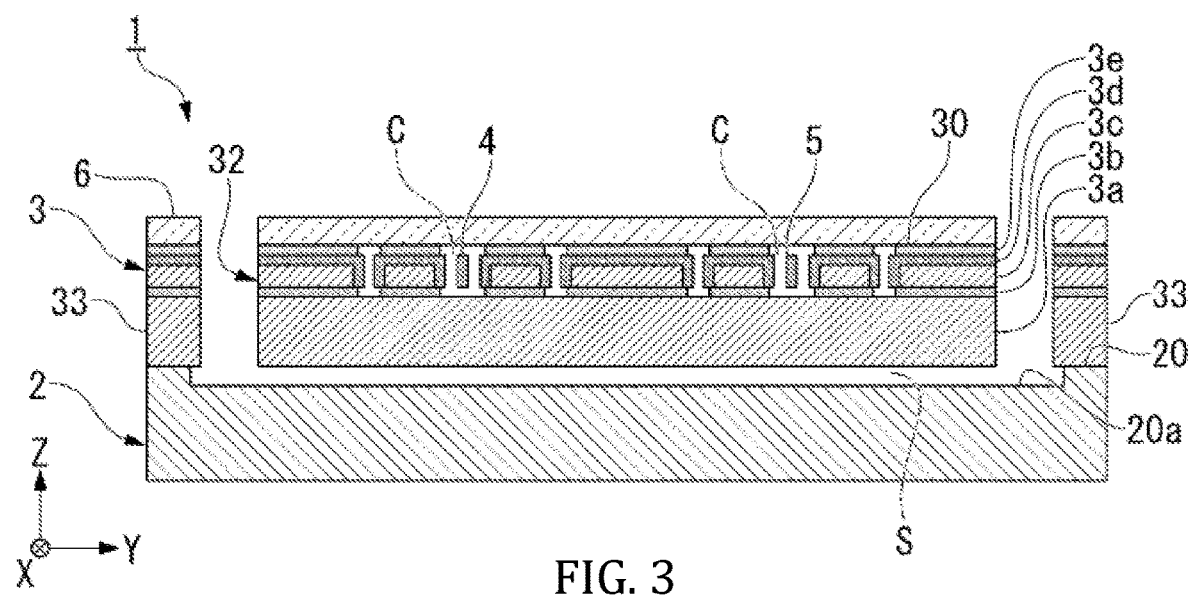
FIG. 3 is a diagram for schematically describing the resonant pressure sensor that is the first embodiment; a sectional view at line A-A in FIG. 2.
Figure 4:
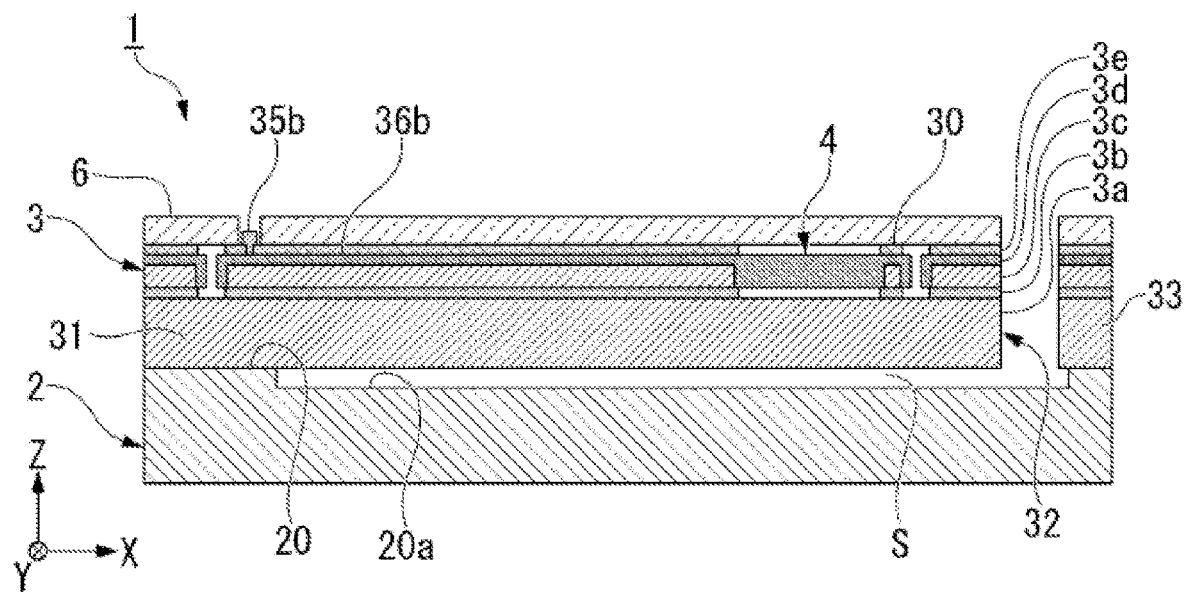
FIG. 4 is a diagram for schematically describing the resonant pressure sensor that is the first embodiment; a sectional view at line B-B in FIG. 2.

FIGS. 1A-1B are sectional views illustrating resonant pressure sensors 1A, 1B of one or more embodiments. FIG. 1A is a diagram illustrating a situation wherein a pressure-receiving fluid F (for example, a liquid or a gas) that is different from a measurement target is used, and FIG. 1B is a diagram illustrating a situation wherein the measurement target (for example, a liquid or a gas) is used as a pressure-receiving fluid K. Moreover, FIG. 2 is a plan view illustrating the pressure sensing unit in the resonant pressure sensors 1A, 1B illustrated in FIGS. 1A-1B, FIG. 3 is a sectional view at line A-A in FIG. 2, and FIG. 4 is a sectional view at line B-B in FIG. 2. Moreover, FIG. 5 is a block diagram illustrating signal processing operations in the resonant pressure sensors 1A, 1B.

[Configuration of Resonant Pressure Sensor]

The resonant pressure sensor 1A of one or more embodiments of includes a pressure sensing unit 1 that can detect a static pressure based on a change value of a resonance frequency. It also has a base substrate (housing-fixed portion) 2, a support substrate (substrate portion) 3, and the pressure-receiving fluid F, which is interposed in a gap S between the base substrate 2 and the support substrate 3 and envelops the support substrate 3. The support substrate 3 has a fixed portion (substrate-fixed portion) 31, in at least one location or more, that is fixed to the base substrate 2. It also has a separated portion (substrate-separated portion) 32 that is separated from the base substrate 2 and extends from the fixed portion 31 in a direction intersecting a Z direction (for example, an X direction). The substrate portion may be referred to as a substrate.

Moreover, the resonant pressure sensor 1A of one or more embodiments of has a first resonator 4 that is disposed in the separated portion 32 of the support substrate 3. A resonance frequency of the first resonator 4 changes based on a strain that arises according to a static pressure applied to the support substrate 3 (separated portion 32) by the pressure-receiving fluid F. That is, a strain arises in the first resonator 4 due to the static pressure applied to the support substrate 3 (separated portion 32) by the pressure-receiving fluid F (via the separated portion 32), and the resonance frequency of the first resonator 4 changes based on this strain.

Moreover, the resonant pressure sensor 1A of one or more embodiments includes a second resonator 5 that is disposed in the separated portion 32 of the support substrate 3. A change amount (pressure sensitivity) of a resonance frequency thereof that changes based on a strain that arises according to the static pressure applied to the support substrate 3 by the pressure-receiving fluid F is less than a change amount (pressure sensitivity) of the resonance frequency of the first resonator 4.

In one or more embodiments, the first resonator 4 above has a function of detecting pressure, and the second resonator 5 above has a function of detecting temperature.

To give a more detailed description, the first resonator 4 is excited by an electrostatic force due to, for example, an AC voltage (excitation signal) being input from one electrode. Moreover, by applying a DC voltage between another electrode and the first resonator 4, as a capacitance between the other electrode and the first resonator 4 when the first resonator 4 is excited changes over time, a current is output to the other electrode. An output voltage of the resonant pressure sensor 1A is obtained by the current output to the other electrode at this time being subjected to current-voltage conversion. By applying appropriate feedback to the excitation signal input from the one electrode based on this output voltage, a stable self-exciting state is obtained at the resonance frequency of the first resonator 4. This operation is realized inside the analog circuit 81 illustrated in the block diagram in FIG. 5. The analog circuit 81 then outputs an output voltage thereof to a frequency counter 82.

Like the first resonator 4, the second resonator 5 is excited by an electrostatic force due to an AC voltage (excitation signal) being input from one electrode. Moreover, by applying a DC voltage between another electrode and the second resonator 5, as a capacitance between the other electrode and the second resonator 5 when the second resonator 5 is excited changes over time, a current is output to the other electrode. An output voltage of the resonant pressure sensor 1A is obtained by subjecting this current output to the other electrode to current-voltage conversion, and by applying appropriate feedback to the excitation signal input from the one electrode based on this output voltage, a stable self-exciting state is obtained at the resonance frequency of the second resonator 5. This operation is realized inside the analog circuit 84 illustrated in the block diagram in FIG. 5, and this analog circuit 84 outputs an output voltage thereof to a frequency counter 85.

Figure 5:
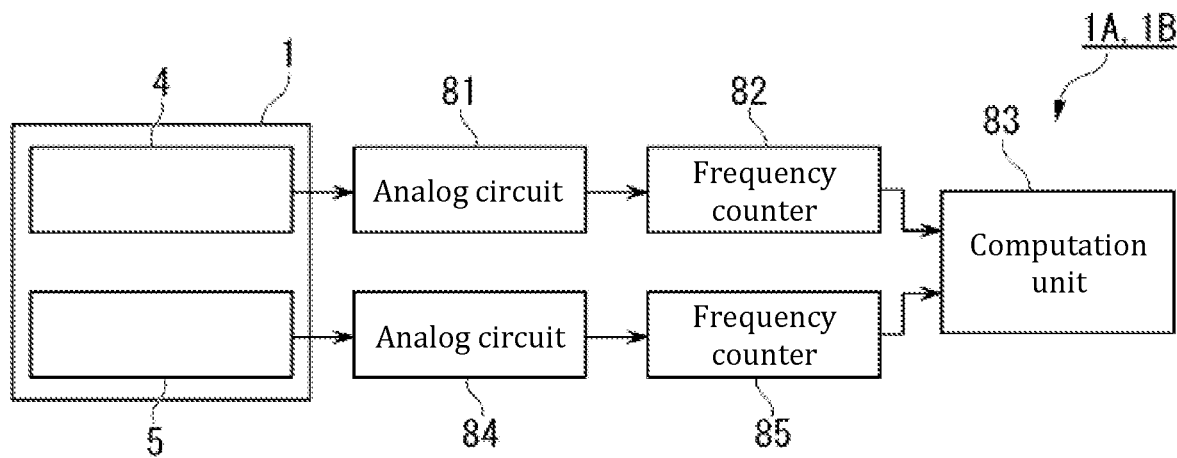
FIG. 5 is a diagram for schematically describing the resonant pressure sensor that is the first embodiment; a block diagram illustrating signal processing operations in the resonant pressure sensor.

Next, in the frequency counter 82 illustrated in FIG. 5, frequency measurement is implemented for the output voltage input from the analog circuit 81. The frequency counter 82 then outputs, to a computation unit 83 (processor), a digital signal that is a count value of a frequency based on a detection signal of the first resonator 4.

In conjunction therewith, in the frequency counter 85 illustrated in FIG. 5, frequency measurement is implemented for the output voltage input from the analog circuit 84, and like the above frequency counter 82, the frequency counter 85 outputs, to the computation unit 83, a digital signal that is a count value of a frequency based on a detection signal of the second resonator 5.

Afterward, in the computation unit 83, a pressure value corresponding to the digital signal input from the frequency counter 82 is calculated, and a pressure value corresponding to the digital signal input from the frequency counter 85 is calculated. These pressure values are output to the outside. At this time, the computation unit 83 uses the digital signal input from the frequency counter 85—that is, a digital signal having a frequency according to an internal temperature of the pressure sensing unit 1 from the second resonator 5—as a temperature correction signal and performs temperature correction for a detection result of the pressure sensing unit 1 according to the internal temperature of the pressure sensing unit 1 determined based on this signal.

By the operations above, pressure values reflecting a correction according to the internal temperature of the pressure sensing unit 1 are obtained based on the changes in the resonance frequencies arising in the first resonator 4 and the second resonator 5 in the resonant pressure sensor 1A.

The above description describes one or more embodiments of measuring pressure using the first resonator 4 and the second resonator 5, but in one or more embodiments, it is also possible to measure pressure using only the first resonator 4.

In the illustrated example, the support substrate 3 is configured so the fixed portion 31 is a fixed end and the separated portion 32 is a free end, and the pressure sensing unit 1 is roughly of a cantilever structure supported at one point.

In the illustrated example, on a surface 30 of a stacked structure formed on the support substrate 3, a shell 6 is further provided so as to cover this surface 30.

The base substrate 2 is a base of the pressure sensing unit 1 and is made of a semiconductor substrate such as a single-crystal silicon wafer. The fixed portion 31 of the support substrate 3 is fixed to a surface 20 side of this base substrate 2. Moreover, a concave portion 20*a* is disposed in a surface 20 of the base substrate 2, in a region other than a peripheral portion (region opposing the separated portion 32) in a plan view of the base substrate 2. As detailed below, in one or more embodiments, this ensures the gap S, into which the pressure-receiving fluid F (K) enters, between the base substrate 2 and the separated portion 32 of the support substrate 3. The resonant pressure sensor according to one or more embodiments of the present invention is not limited to a configuration that ensures a gap, into which the pressure-receiving fluid enters, between the base substrate and the separated portion by providing a concave portion in the base substrate. For example, it may have a configuration that ensures a gap, into which the pressure-receiving fluid enters, between the base substrate and the separated portion by forming the separated portion at a smaller thickness than a thickness of the fixed portion.

The base substrate 2 may be made of a material that, for example, has a thermal expansion coefficient, elastic constant, and the like that are close to those of the support substrate 3, which is detailed below. It may be made of a material wherein these characteristics are identical (the same material). As above, because the support substrate 3 is directly bonded to the base substrate 2, by using materials having similar characteristics for each of these substrates, deformation amounts of when the materials deform due to applied pressure, environmental temperature, or the like become roughly equal. This reduces stress and the like that arise at a bonding interface due to a difference in deformation amounts between the base substrate 2 and the support substrate 3. Therefore, an effect is obtained of improved temperature characteristics, hysteresis, long-term stability, and the like for the resonant pressure sensor 1.

The support substrate 3 is a substrate that supports the first resonator 4 and the second resonator 5, which are detailed below. It has the fixed portion 31, which is fixed to the base substrate 2, and the separated portion 32, which is separated from the concave portion 20*a* provided in the surface 20 of the base substrate 2 by the gap S in the Z direction and extends from the fixed portion 31 in a direction intersecting the Z direction (for example, the X direction). As above, the support substrate 3 configures a cantilever structure by the fixed portion 31 bonded to the base substrate 2 and the separated portion 32 separated from the base substrate 2.

The support substrate 3 has the fixed portion 31 bonded to the surface 20 of the base substrate 2. Moreover, the support substrate 3 includes a sidewall portion 33 that, in a plan view of this support substrate 3, is formed so as to extend from the fixed portion 31 roughly in a U shape and is disposed so as to surround the separated portion 32. This sidewall portion 33 is also a sidewall of the pressure sensing unit 1 and, like the fixed portion 31, is bonded to the surface 20 of the base substrate 2. Moreover, in the support substrate 3, the separated portion 32 is formed roughly in a tongue shape that is separated from the sidewall portion 33 while being surrounded by this sidewall portion 33 and has a function of a cantilever (see the X direction and the Y direction in the diagrams). Moreover, the separated portion 32 is formed roughly in a rectangular shape in a plan view and extends from the fixed portion 31 in the X direction in the diagrams in substantially the same sectional shape (substantially uniformly).

Moreover, a thickness of the separated portion 32 in the Z direction in the diagrams—that is, a thickness of the support substrate 3 in a stacking direction—is constant throughout the X direction and the Y direction in the diagrams.

The first resonator 4 and the second resonator 5 detailed below are disposed in parallel along the extending direction of the separated portion 32 in a position near a tip of the separated portion 32 of the support substrate 3 (end portion on an opposite side of the fixed portion 31). In the illustrated example, the first resonator 4 and the second resonator 5 are each disposed in a position of an active layer 3*c* provided on a support layer 3*a* forming the support substrate 3 and are each disposed in a state wherein a predetermined clearance C is maintained around the first resonator 4 and the second resonator 5.

Furthermore, pads 35*a*, 35*b*, 35*c*, 35*d*, 35*e*, 35*f* that are electrically connected to the first resonator 4 and the second resonator 5 and are for sending the detection signals of each of these resonators to an external control device are disposed on the surface 30, in a position on a fixed-portion 31 side of the support substrate 3. Although a material of these pads 35*a* to 35*f* is not limited in particular, for example, a conventionally known aluminum pad or the like can be adopted without any restrictions whatsoever.

Furthermore, as illustrated in FIG. 2, in one or more embodiments, the pads 35*a*, 35*c* are respectively connected to an electrode 36*a* and an electrode 36*c*, and the pad 35*b* is connected to the first resonator 4 via an electrode 36*b*. Moreover, the pads 35*d*, 35*f* are respectively connected to an electrode 36*d* and an electrode 36*f*, and the pad 35*e* is connected to the second resonator 5 via an electrode 36*e*. Here, in one or more embodiments, as illustrated in the connection structure between the pad 35*b* and the electrode 36*b* in FIG. 4, each pad and each electrode are electrically connected by disposing each pad in a hole portion that penetrates the shell 6 and a TEOS oxide film 3*e* that is described below.

A conductive material that is conventionally used in this field can also be adopted without any restrictions whatsoever as a material for each of the above electrodes 36*a* to 36*f*.

In one or more embodiments, the excitation signal for exciting the first resonator 4 is supplied from the outside using the pads 35*a*, 35*b*, 35*c* and the electrodes 36*a*, 36*b*, 36*c*, and a first detection signal generated by the first resonator 4 (signal having a frequency according to pressure and temperature) is output to the outside. Moreover, the excitation signal for exciting the second resonator 5 is supplied from the outside using the pads 35*d*, 35*e*, 35*f* and the electrodes 36*d*, 36*e*, 36*f*, and a second detection signal generated by the second resonator 5 (signal having a frequency according to temperature alone or according to pressure and temperature) is output to the outside.

Although the material of the support substrate 3 is not limited in particular, as above, it may be made of a material having characteristics similar to those of the base substrate 2 whereto the fixed portion 31 of this support substrate 3 is directly bonded or it may be made of the same material. Details are given below, but as the support substrate 3, one made of a semiconductor substrate such as a single-crystal silicon wafer can be adopted.

Furthermore, as in the layered structure illustrated in the sectional view in FIG. 3, an embedded oxide film 3b, the active layer 3c, an impurity diffusion layer 3d, and the TEOS (tetraethoxysilane) oxide film 3e are sequentially stacked on the support layer 3a forming the support substrate 3 of one or more embodiments, forming a so-called SOI (silicon on insulator) structure. Moreover, in the example illustrated in FIG. 3 and the like, the first resonator 4 and the second resonator 5 are formed in a position of the active layer 3c in the above layered structure formed on the support layer 3a.

The support layer 3a that forms the support substrate 3 is single-crystal silicon doped with an impurity and is a layer having a uniform boron concentration of about $1 \times 10^{18}$ to $1 \times 10^{19}$ ($cm^{-3}$). Moreover, the support layer 3a functions as a base in the above SOI structure.

The embedded oxide film 3b is an insulating film that is formed on the support layer 3a of the support substrate 3 and is the single-crystal silicon constituting the support layer 3a subjected to an oxidation process. It has a function of electrically insulating the above electrodes from each other (insulating the electrode 36a and the electrode 36c from each other and insulating the electrode 36d and the electrode 36f from each other).

The active layer 3c is doped single-crystal silicon and is a layer having a uniform boron concentration of, for example, about $1 \times 10^{17}$ to $1 \times 10^{18}$ ($cm^{-3}$).

The impurity diffusion layer 3d is a layer wherein boron (B) is diffused at a high concentration as an impurity in the active layer 3c.

Moreover, the TEOS oxide film 3e is a silicon oxide film formed using tetraethoxysilane (TEOS gas) as a material from the active layer 3c wherefrom the impurity diffusion layer 3d is formed. Like the embedded oxide film 3b, it functions as an insulating film that electrically insulates the above electrodes from each other (insulates the electrode 36a and the electrode 36c from each other and insulates the electrode 36d and the electrode 36f from each other).

The first resonator 4 is a pressure-detecting resonator in the resonant pressure sensor 1 of one or more embodiments and is disposed in the separated portion 32 of the support substrate 3.

As illustrated in FIG. 2 to FIG. 5, the first resonator 4 is formed in a linear shape by machining the single-crystal silicon forming the active layer 3c provided on the support layer 3a forming the support substrate 3 and is formed in a position of the active layer 3c in the Z direction.

The first resonator 4 is disposed so as to be interposed in the Y direction between the electrode 36a and the electrode 36c.

Moreover, the predetermined clearance C is ensured around the first resonator 4 in the Y direction and the Z direction, and the first resonator 4 is formed as a double-supported beam structure wherein both end portions in the X direction are supported.

Moreover, the first resonator 4 is vacuum sealed between the support substrate 3 and the shell 6 by the surrounding clearance C being held in a vacuum state by the shell 6, which is detailed below.

Furthermore, the first resonator 4 is excited by an excitation signal input from the electrode 36a and outputs a signal having a frequency according to the applied pressure from the electrode 36c.

That is, a strain according to the static pressure applied to the support substrate 3 by the pressure-receiving fluid F (K) arises in the first resonator 4, and as above, a change value of the resonance frequency of the first resonator 4 that changed based on this strain is output as a frequency signal to the frequency counter 82 via the analog circuit 81 illustrated in the block diagram in FIG. 5. In the frequency counter 82, frequency measurement is implemented for the output voltage input from the analog circuit 81, and a digital signal that is a count value of the frequency is output to the computation unit 83. Then, in the computation unit 83, a pressure value corresponding to the digital signal input from the frequency counter 82 is computed.

In the pressure sensing unit 1, the first resonator 4 is disposed so a static pressure (isotropic pressure) that acts on this pressure sensing unit 1 can be detected by the above configuration.

In one or more embodiments, the first resonator 4 is made of a semiconductor material including an impurity, a concentration of the impurity is $1 \times 10^{20}$ ($cm^{-3}$) or higher, and an atomic radius of the impurity is smaller than an atomic radius of silicon, which is the base material.

To give a more detailed description, as the impurity included in the first resonator 4, for example, boron (B) and phosphorous (P) can be mentioned. In this situation, because the impurity whose atomic radius is smaller than the silicon constituting the first resonator 4 replaces this silicon, the first resonator 4 deforms to relax this lattice strain. However, because fixed ends 4a, 4b of the first resonator 4 are fixed, a tensile stress acts on/is imparted to the first resonator 4 in advance. As a result, normally, under a high-pressure static pressure, when no tensile stress is being imparted, the first resonator 4 may buckle under a compressive stress arising in the fixed ends 4a, 4b of the first resonator 4 and its pressure measurement function may be lost. In contrast, in the pressure sensing unit 1 of one or more embodiments, a tensile stress is imparted in advance, and a compressive stress acting on this pressure sensing unit 1 can be offset by this tensile stress. This can prevent the first resonator 4 from buckling and enables the pressure measurement function to be maintained.

Here, a situation is described wherein, for example, a semiconductor material wherein the impurity boron is included at a concentration of $1 \times 10^{20}$ ($cm^{-3}$) or higher and an atomic radius of the impurity is smaller than an atomic radius of the base material silicon is applied for the resonator having an H shape in a plan view taught in non-patent literature 1 above (H-shaped resonator; see FIGS. 1A-1B in non-patent literature 1).

Even in, for example, a resonant pressure sensor provided with the H-shaped resonator of non-patent literature 1, by introducing boron at a concentration of $1 \times 10^{20}$ ($cm^{-3}$) or higher at a selective epitaxial step of forming the resonator, a pressure sensor that can measure high static pressure can be realized while preventing buckling of the resonator.

In the pressure sensing unit 1 provided in the resonant pressure sensor 1A of one or more embodiments, from a viewpoint of being able to increase sensitivity and measurement precision as a pressure sensor, it may be for the disposition position of the first resonator 4 in the separated portion 32 to be a position that is one-half or more and two-thirds or less of a length of the separated portion 32 in the X direction illustrated in FIG. 2, the starting point being a connection location between the fixed portion 31 and the separated portion 32.

The second resonator 5 is a temperature-detecting resonator in the resonant pressure sensor 1A of one or more embodiments. Like the first resonator 4 for pressure detection, it is disposed in the separated portion 32 of the support substrate 3. In the example illustrated in FIG. 2 and the like, the second resonator 5 is disposed parallel to the first resonator 4 (extending in the X direction) while being separated from the first resonator 4 in the Y direction. Moreover, it is disposed in a position in the separated portion 32 wherein it is symmetrical to the first resonator 4 in the Y direction.

That is, as illustrated in FIG. 2 to FIG. 5, the second resonator 5 is formed in a linear shape extending in the X direction by machining the single-crystal silicon forming the active layer 3c provided on the support layer 3a forming the support substrate 3 and is formed in a position of the active layer 3c in the Z direction.

The second resonator 5 is disposed so as to be interposed in the Y direction between the electrode 36d and the electrode 36f.

Moreover, like the first resonator 4, the predetermined clearance C is ensured around the second resonator 5 in the Y direction and the Z direction, and the second resonator 5 is formed as a double-supported beam structure wherein both end portions in the X direction are supported.

Moreover, like the first resonator 4, the second resonator 5 is vacuum sealed between the support substrate 3 and the shell 6 by the surrounding clearance C being held in a vacuum state by the shell 6, which is detailed below.

Furthermore, the second resonator 5 is excited by an excitation signal input from the electrode 36d and outputs, from the electrode 36f, a signal having a frequency according to the pressure—at a different pressure sensitivity than the first resonator 4—as a temperature correction signal at a time of pressure measurement.

The resonance frequencies of the first resonator 4 and the second resonator 5 change according to the pressure and according to a change in Young's modulus or a difference in linear expansion coefficients between materials according to the internal temperature of the pressure sensing unit 1 (temperature substantially equal to a temperature of the first resonator 4 and a temperature of the second resonator 5). Additionally, in one or more embodiments, because the pressure sensitivity of the resonance frequency of the second resonator 5 is less than the pressure sensitivity of the resonance frequency of the first resonator 4, the internal temperature of the pressure sensing unit 1 (temperature detection signal) can be determined based on a difference between a change value of the resonance frequency of the second resonator 5 and the change value of the resonance frequency of the first resonator 4. Then, a more accurate pressure value applied to the pressure sensing unit 1 can be determined based on the determined internal temperature and the change value of the resonance frequency of the first resonator 4 (pressure detection signal).

Here, the "pressure sensitivity of the resonance frequency" above is a change amount of the resonance frequency per unit pressure, and the unit thereof is, for example, "Hz/Pa". Moreover, when representing the pressure sensitivity of the resonance frequency as a rate of change, the unit thereof is, for example, "ppm/Pa".

Furthermore, in the pressure sensing unit 1 provided in the resonant pressure sensor 1A of one or more embodiments, from a viewpoint of increasing temperature detection precision and also contributing to improved sensitivity and measurement precision as a pressure sensor, like the first resonator 4, it may be for the disposition position of the second resonator 5 in the separated portion 32 to be a position that is one-half or more and two-thirds or less of the length of the separated portion 32 in the X direction illustrated in FIG. 2, the starting point being the connection location between the fixed portion 31 and the separated portion 32.

The shell 6 is disposed on the support substrate 3 and, in the example illustrated in FIG. 3 and the like, is disposed so as to cover the surface 30 of the TEOS oxide film 3e disposed in the uppermost layer in the stacked structure on the support layer 3a. Moreover, as above, the shell 6 vacuum seals the first resonator 4 and the second resonator 5. That is, the shell 6 is bonded to the above surface 30 while sealing the clearance C provided around the first resonator 4 and the second resonator 5.

A material of the shell 6 is not limited in particular, but, for example, polysilicon can be used.

The encased resonant pressure sensor 1A or resonant pressure sensor 1B illustrated in FIGS. 1A-1B is configured by housing the pressure sensing unit 1 and the pressure-receiving fluid F or pressure-receiving fluid K inside a housing 50.

By each member constituting the pressure sensing unit 1 such as the base substrate 2 and the support substrate 3 being protected inside the housing 50 and the pressure-receiving fluids F, K being housed therein, the pressure applied from the outside, which is the measurement target, is transmitted to the support substrate 3.

Moreover, the housing 50 functions as a base in the resonant pressure sensors 1A, 1B; in the illustrated example, a pedestal 53 is disposed on an inner bottom portion, and the pressure sensing unit 1 is disposed thereon.

As the housing 50, a box-shaped member formed by, for example, a ceramic such as aluminum oxide or a metal such as Kovar, SUS316L, or Inconel is used.

Moreover, while illustration is omitted in FIGS. 1A-1B, a plurality of terminal portions is disposed in the housing 50. The plurality of terminal portions is electrically connected, by a metal wire that is not illustrated, to the pads 35a to 35f provided in the pressure sensing unit 1 housed in the housing 50. Moreover, the plurality of terminal portions is used in connecting to an external device.

The resonant pressure sensor 1A in the example illustrated in FIG. 1A houses the pressure-receiving fluid F, which is isolated from the measurement target by a pressure-propagating partition-wall member 52, inside the housing 50. It is used, for example, in a use of measuring a static pressure (pressure) in a state wherein a high static pressure from a fluid is applied. The resonant pressure sensor 1A in the illustrated example provides the pressure-propagating partition-wall member 52 in a through hole 51 provided in a top-plate portion of the housing 50. As this pressure-propagating partition-wall member, a metal material, a resin material, or the like that is conventionally used in this field can be adopted without any restrictions whatsoever.

Meanwhile, the resonant pressure sensor 1B in the example illustrated in FIG. 1B houses the pressure-receiving fluid K as the measurement-target fluid inside the housing 50. It is used, for example, in a general use of measuring the atmosphere or the like. In this manner, the resonant pressure sensor 1B illustrated in FIG. 1B is not provided with a pressure-propagating partition-wall member or the like, and the through hole 51 is in a state of being open to the outside atmosphere.

[Operations of Resonant Pressure Sensor]

Next, operations of the above resonant pressure sensor 1A are briefly described. First, when a static pressure acts on the pressure sensing unit 1 via the pressure-receiving fluid F, this pressure is applied to the support substrate 3, and at least a portion of this support substrate 3 (portion other than the fixed portion 31; in one or more embodiments, the separated portion 32) is compressed in a substantially isotropic manner. At this time, a strain according to the compression of the separated portion 32 (pressure applied to the support substrate 3) arises in the first resonator 4, and the resonance frequency of the first resonator 4 changes based on this strain. In conjunction therewith, a strain according to the compression of the separated portion 32 (pressure applied to the support substrate 3) also arises in the second resonator 5, and the resonance frequency of the second resonator 5 changes based on this strain.

The first resonator 4 is resonant due to the excitation signal input from the electrode 36a, and as above, the change value of the resonance frequency arising based on the above strain is as a frequency signal to the frequency counter 82 via the analog circuit 81 illustrated in FIG. 5. In the frequency counter 82, frequency measurement is implemented for the output voltage input from the analog circuit 81, and a digital signal that is a count value of the frequency is output to the computation unit 83.

Furthermore, at the same time as the above pressure measurement by the first resonator 4, the pressure sensing unit 1 can, by using a signal having a frequency according to the internal temperature from the second resonator 5 as a temperature correction signal, perform temperature correction of a detection result of the pressure sensing unit 1 according to the internal temperature of the pressure sensing unit 1 determined based on this signal. That is, the second resonator 5 is resonant due to the excitation signal input from the electrode 36d, and as above, the change value of the resonance frequency arising based on the strain according to the compression of the separated portion 32 is as a frequency signal to the frequency counter 85 via the analog circuit 84. In the frequency counter 85, frequency measurement is implemented for the output voltage input from the analog circuit 84, and a digital signal that is a count value of the frequency is output to the computation unit 83.

Then, in the computation unit 83, a pressure value corresponding to the digital signal input from the frequency counter 82 is computed, and a pressure value corresponding to the digital signal input from the frequency counter 85 is computed. At this time, the computation unit 83 uses the digital signal input from the frequency counter 85, which has a frequency according to the internal temperature from the second resonator 5, as the temperature correction signal and performs temperature correction of the detection result of the pressure sensing unit 1 according to the internal temperature of the pressure sensing unit 1 determined based on this signal.

By the above operations, pressure values reflecting a temperature correction according to the internal temperature of the pressure sensing unit 1 are obtained based on the changes in the resonance frequencies arising in the first resonator 4 and the second resonator 5.

As above, in one or more embodiments, it is also possible to measure pressure using only the first resonator 4, without performing temperature correction using the second resonator 5.

As described above, according to the resonant pressure sensor 1A according to one or more embodiments, provided are at least the support substrate 3, which has the fixed portion 31, which is fixed to the base substrate 2, and the separated portion 32, and the first resonator 4 that is disposed in the separated portion 32 of the support substrate 3 and has a resonance frequency that changes based on a strain that arises according to a static pressure applied to the support substrate 3 by the pressure-receiving fluid F. This enables high linearity and excellent measurement precision to be obtained regardless of a magnitude of a static pressure applied by a liquid, gas, or the like that is a measurement target.

Second Embodiment

The resonant pressure sensor of the second embodiment is detailed below while mainly referring to FIG. 6 as appropriate.

In the description of the resonant pressure sensor of the second embodiment, configurations shared with the resonant pressure sensor 1A of the first embodiment above are imparted the same reference signs in the diagrams, and detailed description thereof may be omitted.

Figure 6:
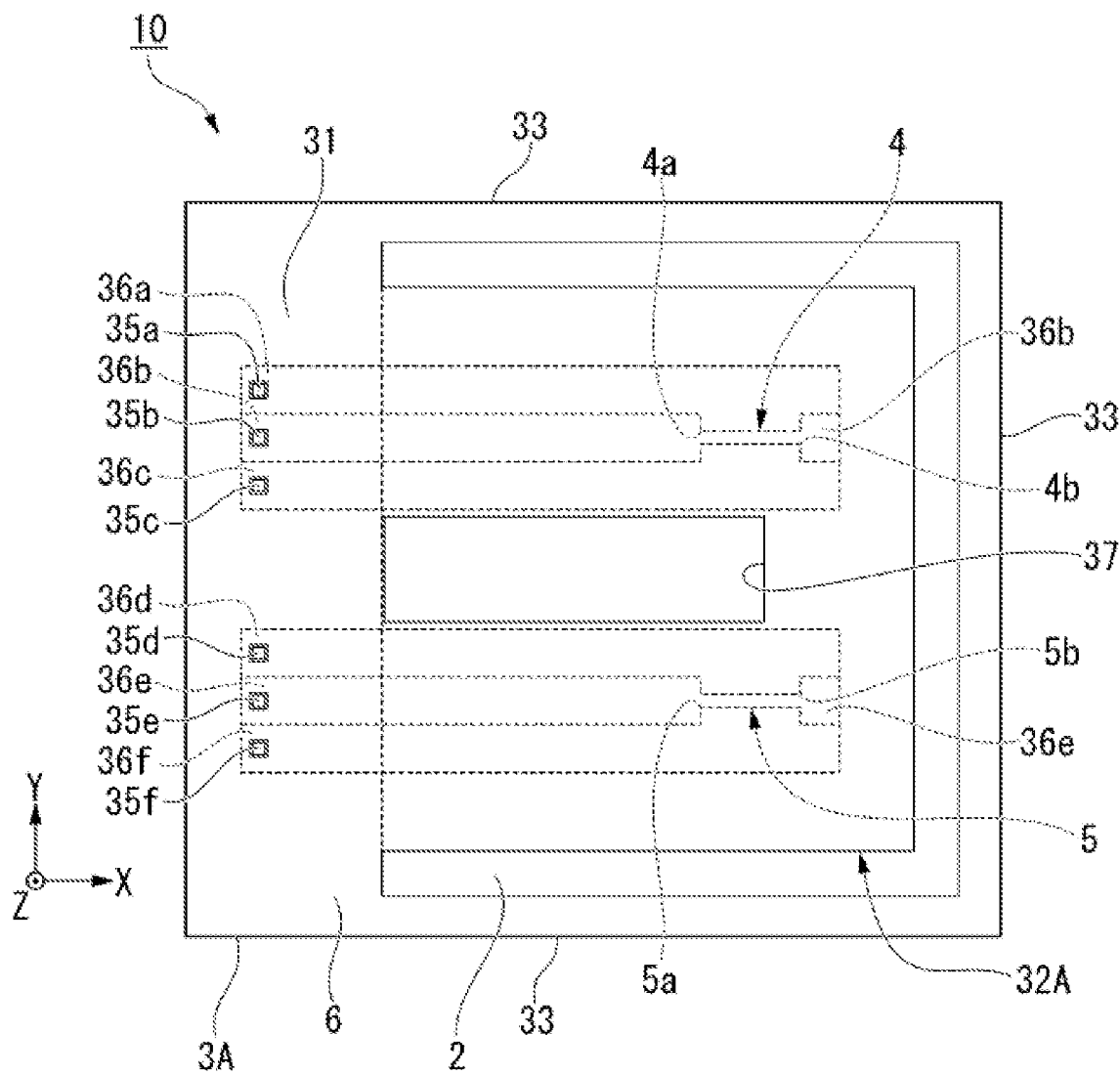
FIG. 6 is a diagram for schematically describing a resonant pressure sensor that is a second embodiment; a plan view illustrating a pressure sensing unit.

Moreover, in FIG. 6, only a pressure sensing unit 10 provided in the resonant pressure sensor of the second embodiment is illustrated, and illustration of, for example, the housing and the pressure-receiving fluid is omitted.

FIG. 6 is a plan view for describing the pressure sensing unit 10 provided in the resonant pressure sensor of the second embodiment. As illustrated in FIG. 6, the resonant pressure sensor of one or more embodiments differs from the resonant pressure sensor 1A of the first embodiment above in that a support substrate (substrate portion) 3A provided in the pressure sensing unit 10 has a strain-mitigating hole 37 provided so as to penetrate this support substrate 3A.

The strain-mitigating hole 37 is disposed so as to penetrate a separated portion (substrate-separated portion) 32A in the support substrate 3A and the shell 6 in the Z direction. Moreover, in a plan view of the support substrate 3A, the strain-mitigating hole 37 in the illustrated example is disposed between the first resonator 4 and the second resonator 5.

According to the resonant pressure sensor of one or more embodiments, because the strain-mitigating hole 37 is disposed in the support substrate 3A, a strain that can be propagated from the base substrate 2 to the separated portion 32A via the fixed portion 31 and a strain that can be propagated in the separated portion 32A are absorbed by the strain-mitigating hole 37. This suppresses (reduces) both the strain that can be propagated from the base substrate 2 to the separated portion 32A via the fixed portion 31 and the strain that can be propagated in the separated portion 32A such that an influence of these strain propagations that can become a factor in measurement error can be decreased and the resonance frequencies of the first resonator 4 and the second resonator 5 indicate changes more reflective of the static pressure.

Therefore, the above effect of obtaining high linearity and excellent measurement precision is more remarkably obtained.

Third Embodiment

The resonant pressure sensor of the third embodiment is detailed below while mainly referring to FIG. 7.

In the description of the resonant pressure sensor of the third embodiment as well, configurations shared with the resonant pressure sensors of the first and second embodiments above are imparted the same reference signs in the diagrams, and detailed description thereof may be omitted.

Figure 7:
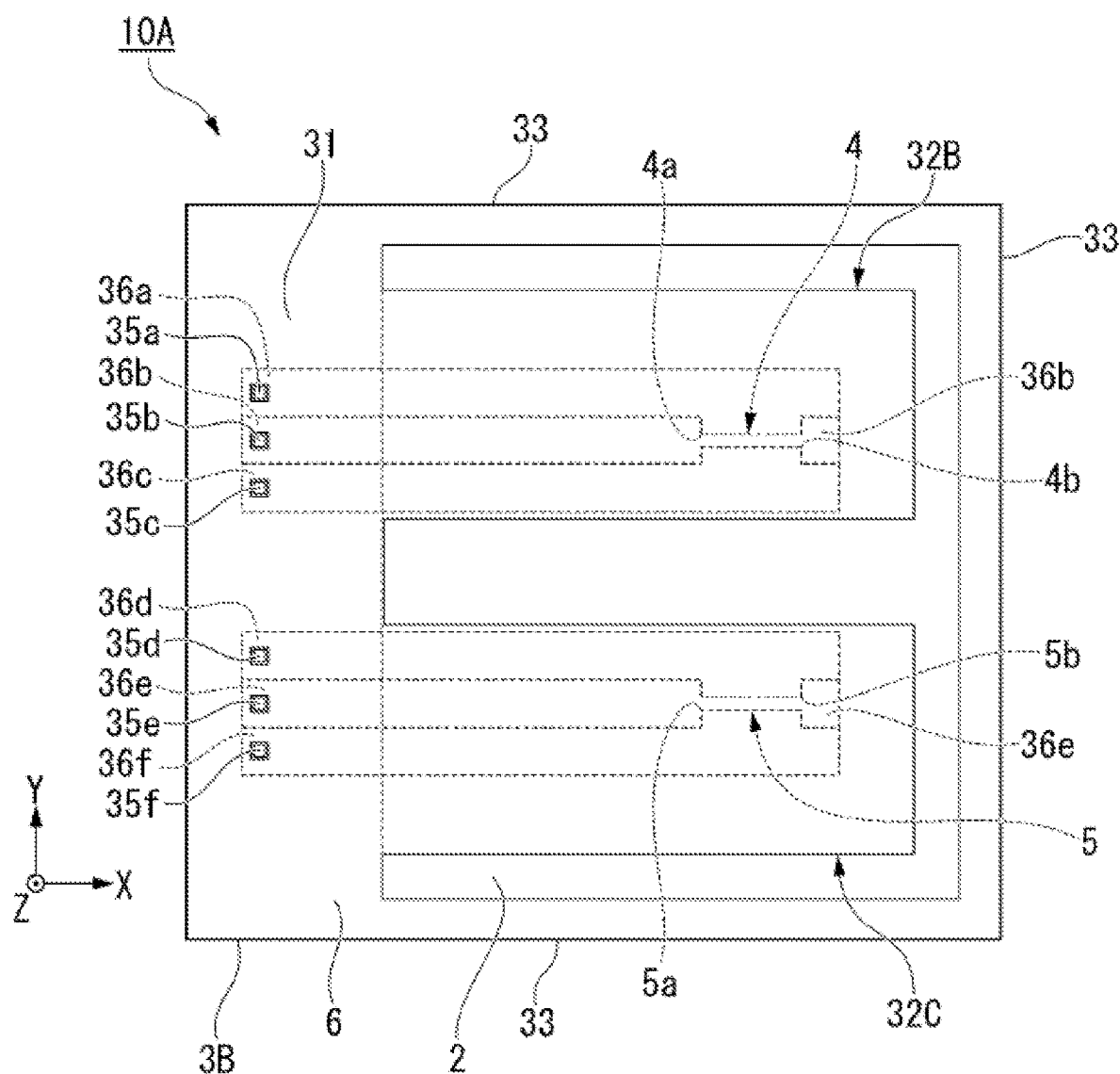
FIG. 7 is a diagram for schematically describing a resonant pressure sensor that is a third embodiment; a plan view illustrating a pressure sensing unit.

Moreover, in FIG. 7 as well, like the resonant pressure sensor of the second embodiment illustrated in FIG. 6, only a pressure sensing unit 10A provided in the resonant pressure sensor of the third embodiment is illustrated, and illustration of the housing, the pressure-receiving fluid, and the like is omitted.

FIG. 7 is a plan view for describing the pressure sensing unit 10A provided in the resonant pressure sensor of the third embodiment. As illustrated in FIG. 7, the resonant pressure sensor of one or more embodiments differs from the resonant pressure sensor 1A and the like of the first and second embodiments above in that in a support substrate (substrate portion) 3B provided in the pressure sensing unit 10A, the first resonator 4 and the second resonator 5 are each disposed in a separated portion (substrate-separated portion) 32B or a separated portion (substrate-separated portion) 32C that differ.

That is, in the pressure sensing unit 10A provided in the resonant pressure sensor of one or more embodiments, the support substrate 3B includes two separated portions 32B, 32C, and the first resonator 4 or the second resonator 5 is disposed in each. The support substrate 3B may further include another substrate-separated portion (32B or 32C).

Specifically, the pressure sensing unit 10A provided in the resonant pressure sensor of one or more embodiments has the separated portion 32B and the separated portion 32C as the substrate-separated portion. The first resonator 4 for pressure detection is disposed in the separated portion 32B, and the second resonator 5 for temperature detection is disposed in the separated portion 32C.

The separated portion 32B and the separated portion 32C are arranged parallel to each other while being separated in the Y direction. Moreover, the separated portion 32B and the separated portion 32C are aligned so as to be roughly in the same position and have roughly the same size in an extending direction thereof (X direction).

According to the resonant pressure sensor of one or more embodiments, because, as above, the first resonator 4 and the second resonator 5 are each disposed in the separated portion 32B or the separated portion 32C that are independently provided, oscillation-energy transfer and the like are less likely to arise.

Therefore, it becomes possible to further suppress errors in pressure measurement.

In the example illustrated in FIG. 7, a configuration that provides two separated portions 32B, 32C in one support substrate 3B is illustrated, but the present invention is not limited thereto. For example, three or more separated portions (substrate-separated portion) may be provided in one support substrate (substrate portion). Moreover, for example, a configuration wherein, upon providing a plurality of support substrates (substrate portion), separated portions are individually (independently) provided to each support substrate—that is, a configuration having at least two or more separated portions provided to a plurality of support substrates—may be adopted.

Fourth Embodiment

The resonant pressure sensor of the fourth embodiment is detailed below while mainly referring to FIG. 8 to FIG. 10.

In the description of the resonant pressure sensor of the fourth embodiment as well, configurations shared with the resonant pressure sensors of the first, second, and third embodiments above are imparted the same reference signs in the diagrams, and detailed description thereof may be omitted.

Figure 8:
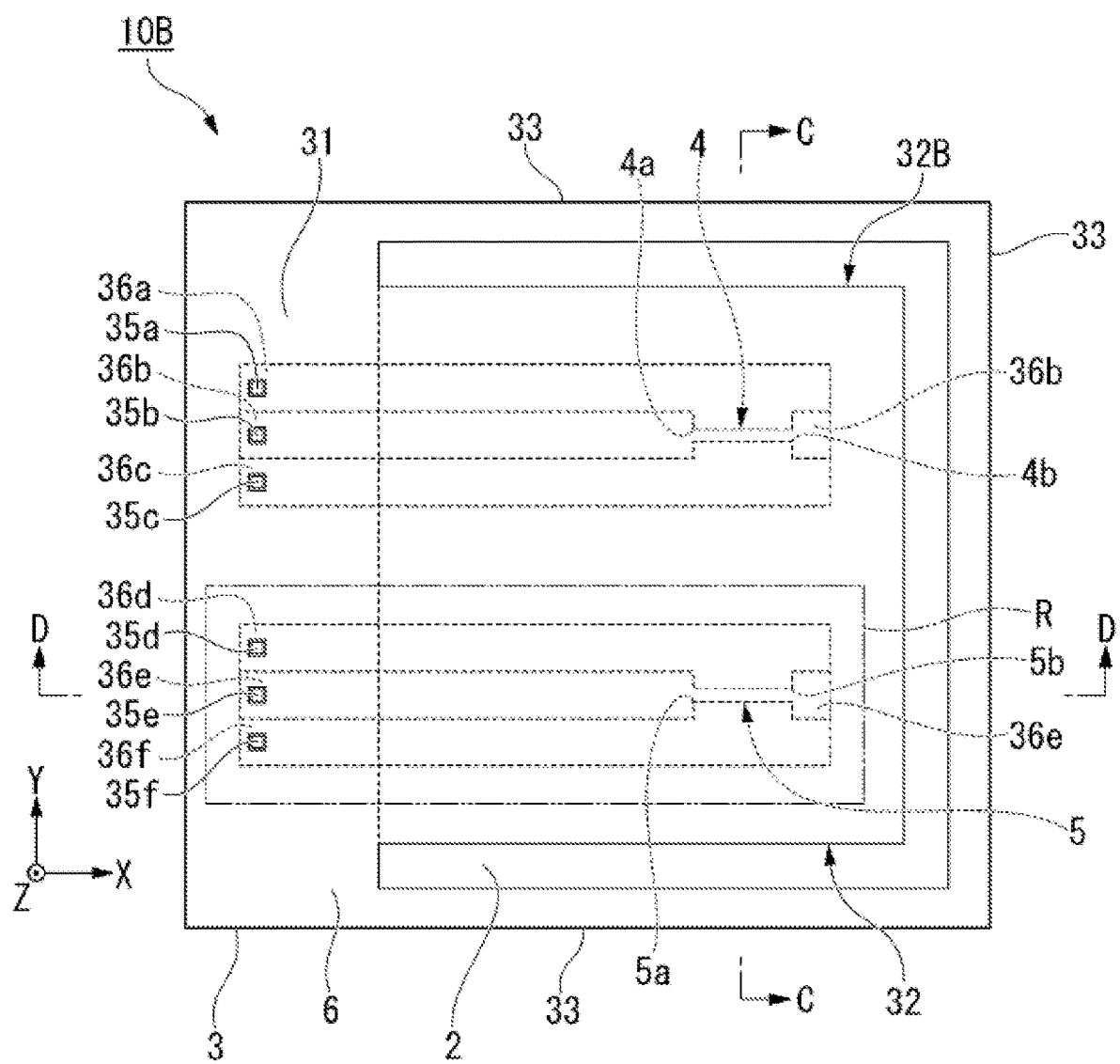
FIG. 8 is a diagram for schematically describing a resonant pressure sensor that is a fourth embodiment; a plan view illustrating a pressure sensing unit.
Figure 9:
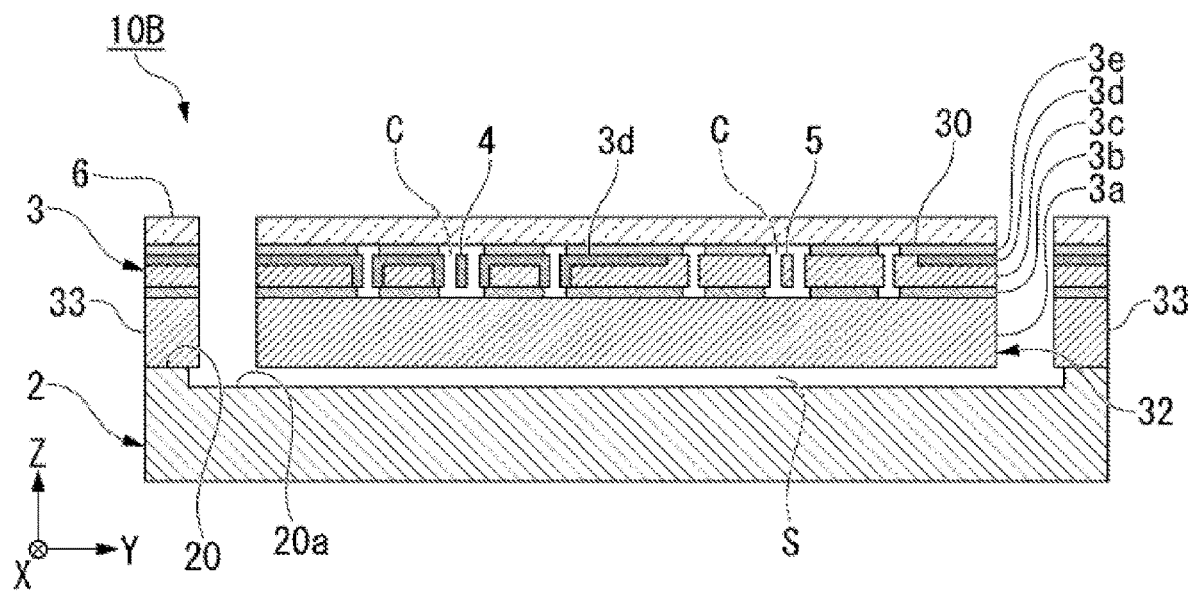
FIG. 9 is a diagram for schematically describing the resonant pressure sensor that is the fourth embodiment; a sectional view at line C-C in FIG. 8.
Figure 10:
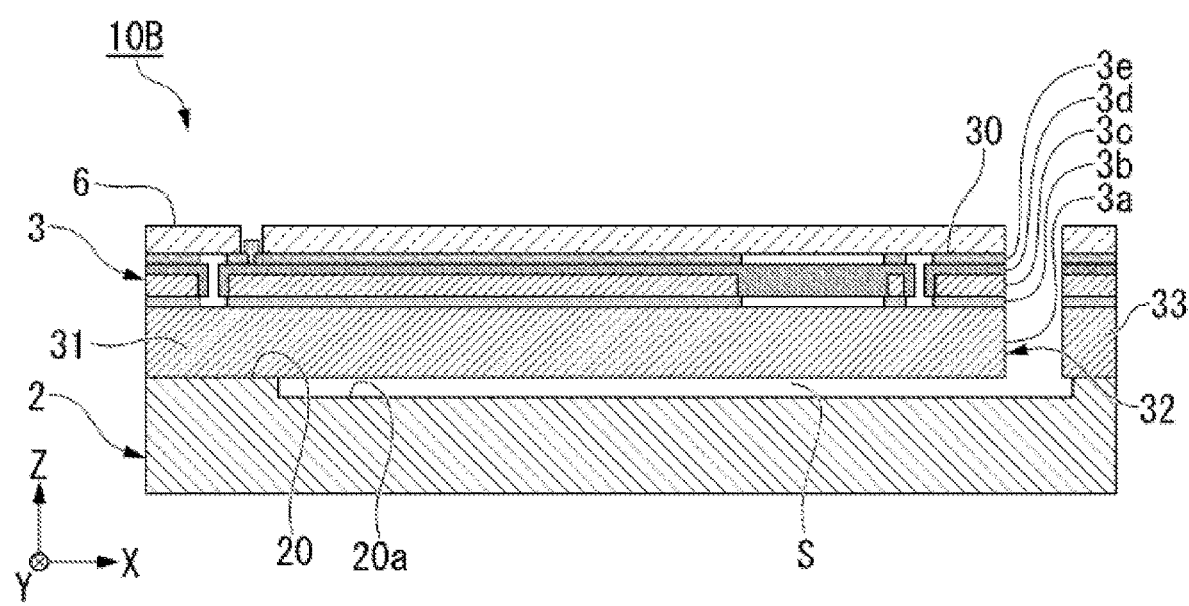
FIG. 10 is a diagram for schematically describing the resonant pressure sensor that is the fourth embodiment; a sectional view at line D-D in FIG. 8.

Moreover, in FIG. 8 to FIG. 10 as well, like the resonant pressure sensors of the second and third embodiments illustrated in FIG. 6 and FIG. 7, only a pressure sensing unit 10B provided in the resonant pressure sensor of the fourth embodiment is illustrated, and illustration of the housing, the pressure-receiving fluid, and the like is omitted.

FIG. 8 is a plan view for describing the pressure sensing unit 10B provided in the resonant pressure sensor of the fourth embodiment, FIG. 9 is a sectional view at line C-C in FIG. 8, and FIG. 10 is a sectional view at line D-D in FIG. 8.

In the pressure sensing unit 10B provided in the resonant pressure sensor of one or more embodiments illustrated in FIGS. 8 to 10, the first resonator 4 and the second resonator 5 are made of a single-crystal silicon material. Moreover, in the first resonator 4 and the second resonator 5 in the pressure sensing unit 10B, the impurity concentrations in each are values that differ by at least one order of magnitude or more when the unit is made to be ($cm^{-3}$). Moreover, the pressure sensing unit 10B is configured so a temperature coefficient of the resonance frequency of the second resonator 5 is greater than a temperature coefficient of the resonance frequency of the first resonator 4. Here, the above temperature coefficient of the resonance frequency is a rate of change of the resonance frequency per unit temperature, and the unit thereof is, for example, (ppm/° C.).

Described more specifically, in the resonant pressure sensor of one or more embodiments, for example, when the impurity concentration of one among the first resonator 4 and second resonator 5 made of the single-crystal silicon material is [$a \times 10^n (cm^{-3})$], the impurity concentration of the other among these is [$a \times 10^{n-1}(cm^{-3})$] or less or [$a \times 10^{n+1}(cm^{-3})$] or more.

The resonant pressure sensor of one or more embodiments is configured to make the temperature coefficients of the resonance frequencies different by a processing flow, whose illustration is omitted, wherein an impurity of a high concentration is diffused in the first resonator 4 and no impurity diffusion is performed in the second resonator 5. That is, in one or more embodiments, no impurity diffusion is performed in a non-diffusion region R—that is, a region near the second resonator 5—of the support substrate 3 illustrated in FIG. 8.

More specifically, as illustrated in FIG. 9, in the pressure sensing unit 10B provided in the resonant pressure sensor of one or more embodiments, the impurity diffusion layer 3d is formed in a periphery of the first resonator 4 in the support substrate 3, but the impurity diffusion layer 3d is not formed in a periphery of the second resonator 5. This enables the pressure sensing unit 10B to have a configuration wherein the impurity concentrations greatly differ between the first resonator 4 and the second resonator 5.

It is generally known that a temperature coefficient of a resonance frequency of a resonator changes according to a concentration and type of an impurity included in the resonator, a crystal orientation of a material constituting the resonator, and a resonance mode of the resonator used in pressure measurement. In one or more embodiments, as above, the temperature coefficient of the resonance frequency of the second resonator 5 is made greater than the temperature coefficient of the resonance frequency of the first resonator 4 by setting the impurity concentrations [$cm^{-3}$] at values that differ by at least one order of magnitude or more between the first resonator 4 and the second resonator 5. That is, in one or more embodiments, when the resonant pressure sensor undergoes a temperature change, this signifies that the change amount of the resonance frequency of the second resonator 5 becomes greater than the change amount of the resonance frequency of the first resonator 4. That is, because a temperature sensitivity of the second resonator 5 becomes higher than a temperature sensitivity of the first resonator 4, in pressure measurement using the first resonator 4, temperature correction according to temperature measurement using the second resonator 5 (temperature correction using the internal temperature calculated from the resonance frequencies in the two resonators (the first resonator 4 and the second resonator 5)) can be performed with high precision. Therefore, temperature-correction precision in pressure measurement using the first resonator 4 is improved.

As one example, a situation is described wherein boron (B) is used as the impurity; in the support substrate 3 made of the single-crystal silicon material, a crystal orientation of a region wherein the first resonator 4 is disposed (material constituting the first resonator 4) is the <110> direction and a normal direction of a wafer surface is the <100> direction; and fundamental oscillation at the fixed ends 4a, 4b is in a mode of in-plane oscillation in the wafer. In the above conditions, when the impurity concentration of the first resonator 4 is made to be about $10^{20}$ (cm$^{-3}$) and the impurity concentration of the second resonator 5 is made to be about $10^{18}$ (cm$^{-3}$), the temperature coefficients of the resonance frequencies become about −10 (ppm/° C.) in the first resonator 4 and about −30 (ppm/° C.) in the second resonator 5. That is, because the temperature sensitivity of the second resonator 5 becomes higher than the temperature sensitivity of the first resonator 4, in pressure measurement using the first resonator 4, temperature correction according to temperature measurement using the second resonator 5 can be performed with high precision. Therefore, temperature-correction precision in pressure measurement using the first resonator 4 is improved.

Furthermore, in one or more embodiments, although detailed illustration is omitted, a thickness dimension of the second resonator 5 along a thickness direction of the support substrate 3 is greater than a thickness dimension of the first resonator 4. That is, a thickness dimension of the second resonator 5 in the stacking direction of the support substrate 3—that is, the Z direction—is greater than the thickness dimension of the first resonator 4. Adopting this configuration further increases measurement precision of the internal temperature by the second resonator 5 and also improves temperature-correction precision. As a result, measurement precision of pressure by the pressure sensing unit 1 is also increased.

The above configuration wherein the thickness dimension of the second resonator 5 is greater than the thickness dimension of the first resonator 4 is dependent on conditions of the manufacturing process described below.

For example, when introducing the impurity to the first resonator 4 at a high concentration as above, first, to prevent the impurity from being introduced in a region forming the second resonator 5, a mask made of a thermal oxide film is formed on this region.

Next, an impurity diffusion source is formed on the first resonator 4 using a gas material or a coating glass material, and afterward, the impurity is introduced and diffused in the first resonator 4 under a high temperature of 1,000° C. or higher. Because this process of introducing and diffusing the impurity in the first resonator 4 under a high temperature is generally implemented while supplying oxygen, on a face whereon a silicon surface is exposed, the silicon is oxidized, forming a silicon oxide film.

As a result of the above process, the above thickness dimension of the first resonator 4 becomes smaller than an original thickness of the active layer. Meanwhile, the thickness dimension of the second resonator 5 becomes equal to the original thickness of the active layer. This causes the thickness dimension of the second resonator 5 to become greater than the thickness dimension of the first resonator 4.

The "thickness dimension along a thickness direction of the support substrate (substrate portion) 3" described in one or more embodiments is the stacking direction of the support substrate 3 and refers to a thickness direction in the Z direction in the diagrams.

Fifth Embodiment

The resonant pressure sensor of the fifth embodiment is detailed below while mainly referring to FIG. 11 and FIG. 12.

In the description of the resonant pressure sensor of the fifth embodiment as well, configurations shared with the resonant pressure sensors of the first to fourth embodiments above are imparted the same reference signs in the diagrams, and detailed description thereof may be omitted.

Figure 11:
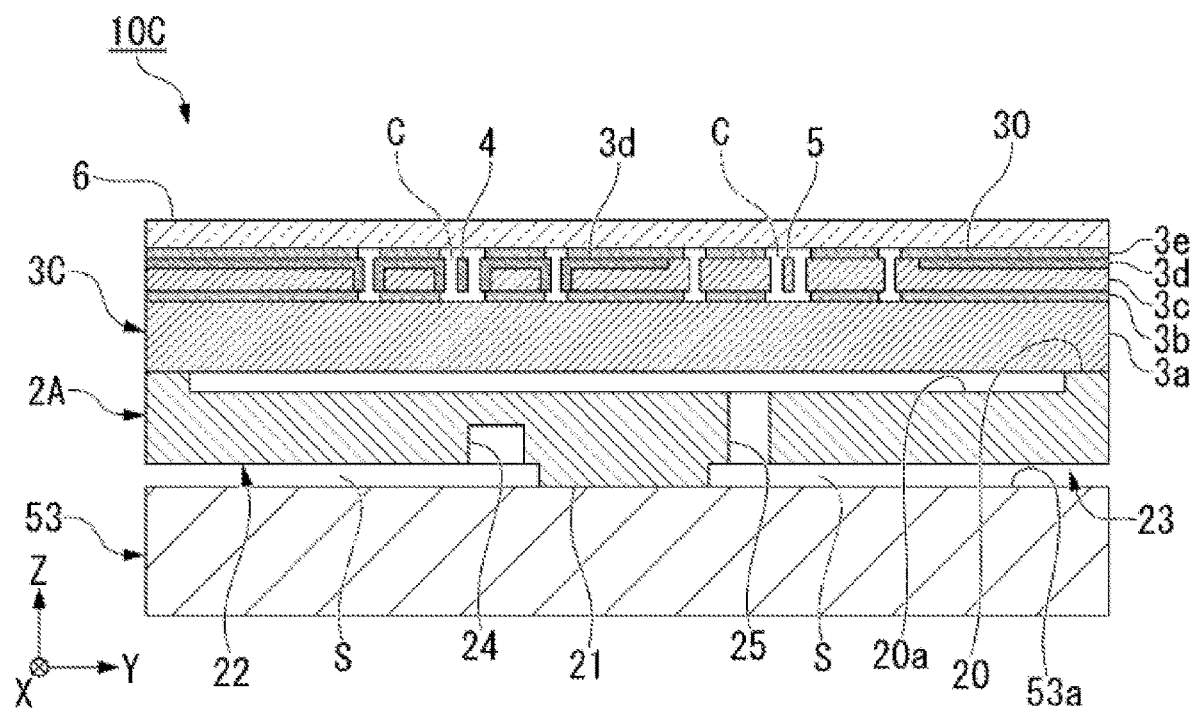
FIG. 11 is a diagram for schematically describing a resonant pressure sensor that is a fifth embodiment; a sectional view illustrating a pressure sensing unit provided on a pedestal.
Figure 12:
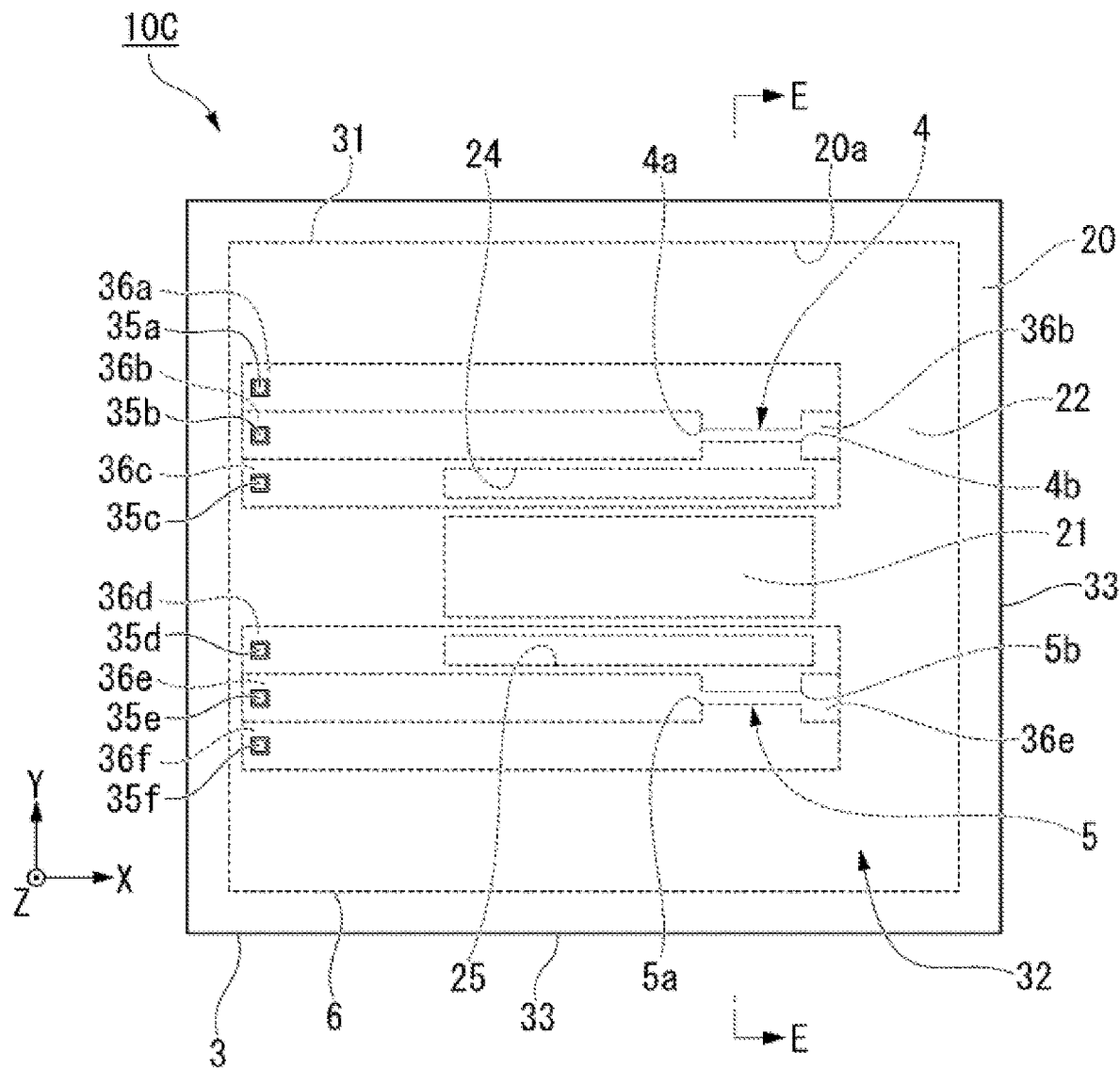
FIG. 12 is a diagram for schematically describing the resonant pressure sensor that is the fifth embodiment; a plan view of the pressure sensing unit illustrated in FIG. 11.

Moreover, in FIG. 11 and FIG. 12 as well, like the resonant pressure sensors of the second to fourth embodiments illustrated in FIG. 6 to FIG. 10, only a pressure sensing unit 10C provided in the resonant pressure sensor of the fifth embodiment is illustrated, and illustration of the housing, the pressure-receiving fluid, and the like is omitted.

FIG. 11 is a sectional view for briefly describing the pressure sensing unit 10C provided in the resonant pressure sensor of the fifth embodiment, and FIG. 12 is a plan view thereof. FIG. 11 is a sectional view at line E-E in FIG. 12.

As illustrated in FIG. 11, in the resonant pressure sensor according to one or more embodiments, the pressure sensing unit 10C, which has a base substrate (substrate portion) 2A and a support substrate (support portion) 3C, is further provided with the pedestal (fixed substrate (housing-fixed portion)) 53, whereto the base substrate 2A is fixed.

Moreover, in the pressure sensing unit 10C provided in the resonant pressure sensor according to one or more embodiments, the base substrate 2A has a fixed portion (substrate-fixed portion) 21, in at least one location or more, that is fixed to a surface 53a of the pedestal 53. It also has separated portions (substrate-separated portion) 22, 23 that are separated from the pedestal 53 by a distance S in the Z direction and extend from the fixed portion 21 along the surface 53a (direction intersecting the Z direction; for example, the X direction). In the illustrated example, the base substrate 2A is configured as a cantilever structure wherein the fixed portion 21 is a support point and the separated portion 22 and the separated portion 23 are free ends.

Moreover, the resonant pressure sensor according to one or more embodiments is configured so the pressure-receiving fluid, whose illustration is omitted in FIG. 11, envelops the base substrate 2A (separated portion 22 and separated portion 23) while being interposed in the gap S between the pedestal 53 and the base substrate 2A.

In the resonant pressure sensor according to one or more embodiments illustrated in FIG. 11 and FIG. 12 as well, like the resonant pressure sensor of the fourth embodiment illustrated in FIGS. 8 to 10, the impurity diffusion layer 3d is formed in the periphery of the first resonator 4 in the support substrate 3C. Meanwhile, the impurity diffusion layer 3d is not formed in the periphery of the second resonator 5.

According to the resonant pressure sensor of one or more embodiments, by adopting the above configuration wherein the base substrate 2A includes the fixed portion 21 and the separated portions 22, 23, like the resonant pressure sensors described in the first to fourth embodiments, the resonance frequency of the first resonator 4 changes based on a strain arising according to a static pressure applied to the support substrate 3C by the pressure-receiving fluid. This enables high linearity and excellent measurement precision to be obtained regardless of a magnitude of a static pressure applied by a liquid, gas, or the like that is a measurement target.

Meanwhile, as above, the resonant pressure sensor of one or more embodiments is configured so the base substrate 2A has the separated portions 22, 23 relative to the pedestal 53. As such, the support substrate 3C may be provided with a separated portion described in the first to fourth embodiments but does not need to be provided with such. FIG. 11 illustrates a separated portion is also provided between the support substrate 3C and the concave portion 20a of the base substrate 2A.

Like the base substrate and the support substrate, a material such as a single-crystal silicon wafer can be used as the pedestal 53 without any restrictions whatsoever.

In the resonant pressure sensor according to one or more embodiments, as in the illustrated example, it may be for at least one among a concave strain-isolating groove 24 and a strain-isolating hole 25 that penetrates the base substrate 2A to be provided in at least a portion of the separated portions 22, 23 in the base substrate 2A. In the illustrated example, the concave strain-isolating groove 24 is disposed in one location of the separated portion 22 so as to be opened toward a pedestal 53 side, and the strain-isolating hole 25 is disposed in one location of the separated portion 23.

In one or more embodiments, because the above strain-isolating groove 24 and strain-isolating hole 25 are provided in the base substrate 2A, a strain that can be propagated from the pedestal 53 to the support substrate 3C via the base substrate 2A (separated portion 22 and separated portion 23) and a strain that can be propagated in the base substrate 2A are absorbed by the strain-isolating groove 24 or the strain-isolating hole 25. This suppresses (reduces) a strain propagated from the pedestal 53 to the support substrate 3C via the base substrate 2A (separated portion 22 and separated portion 23) and the strain that can be propagated in the base substrate 2A. As such, an influence of these strain propagations that can become a factor in measurement error can be reduced, and the resonance frequencies of the first resonator 4 and the second resonator 5 indicate changes more reflective of the static pressure. Therefore, the above effect of obtaining high linearity and excellent measurement precision is more remarkably obtained.

<Other Configurations>

Embodiments of the present invention are described above. However, these embodiments are illustrated as one example and do not limit the scope of the present invention. These embodiments can be implemented in other various forms and can be applied with various omissions, substitutions, and modifications within a scope that does not depart from the spirit of the invention. These embodiments and variations thereof are included in the scope and spirit of the invention and are likewise included in the invention stated in the scope of patent claims and scopes equivalent thereto.

For example, in the above embodiments, the separated portion in the support substrate or the base substrate has a so-called cantilever structure supported by the base substrate or the pedestal (fixed substrate) at one fixed portion, but the present invention is not limited thereto. For example, a configuration wherein the separated portion is supported at two or more fixed portions can also be adopted.

Furthermore, the configuration adopted in the resonant pressure sensor according to one or more embodiments—wherein the support substrate includes the separated portion having the gap between itself and the base substrate and a resonator is disposed in this separated portion—can also be applied in, for example, a resonant pressure sensor provided with a resonator having an H shape in a plan view (H-shaped resonator; for example, see FIGS. 1A-1B in non-patent literature 1 above). For example, actions and effects similar to those of the above embodiments can be obtained by providing, instead of a resonator described in the above embodiments, the above H-shaped resonator in spaces that are the separated portions 32, 32A, 32B, 32C in the support substrates 3, 3A, 3B, 3C and are vacuum-sealed by the shell 6.

The resonant pressure sensor according to one or more embodiments has high linearity and excellent measurement precision regardless of a magnitude of a static pressure applied by a fluid or the like that is a measurement target. Therefore, the resonant pressure sensor according to one or more embodiments is particularly useful in a use wherein a high static pressure is applied. Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

1A, 1B . . . resonant pressure sensor
1, 10, 10A, 10B, 10C . . . pressure sensing unit
2 . . . base substrate (housing-fixed portion)
2A . . . base substrate (substrate portion/substrate)
20 . . . surface
20a . . . concave portion
21 . . . fixed portion (substrate-fixed portion)
22, 23 . . . separated portion (substrate-separated portion)
24 . . . strain-isolating groove
25 . . . strain-isolating hole
3, 3A, 3B, 3C . . . support substrate (substrate portion/substrate)
3a . . . support layer
3b . . . embedded oxide film
3c . . . active layer
3d . . . impurity diffusion layer
3e . . . TEOS oxide film
30 . . . surface
31 . . . fixed portion (substrate-fixed portion)
32, 32A, 32B, 32C . . . separated portion (substrate-separated portion)
33 . . . sidewall portion
35a, 35b, 35c, 35d, 35e, 35f . . . pad
36a, 36b, 36c, 36d, 36e, 36f . . . electrode
37 . . . strain-mitigating hole
R . . . non-diffusion region
4 . . . first resonator
4a, 4b . . . fixed end
5 . . . second resonator
5a, 5b . . . fixed end
6 . . . shell
50 . . . housing
51 . . . through hole
52 . . . pressure-propagating partition-wall member
53 . . . pedestal (fixed substrate (housing-fixed portion))
53a . . . surface
S . . . gap
C . . . clearance
F, K . . . pressure-receiving fluid

What is claimed is:

1. A resonant pressure sensor, comprising:
a housing;
a housing-fixed portion that is fixed to the housing;
a substrate that comprises:
   a substrate-fixed portion that is fixed to the housing-fixed portion; and
   a substrate-separated portion that is separated from the housing-fixed portion in a first direction and extends from the substrate-fixed portion;
a first resonator that is disposed in the substrate-separated portion and that detects a change of a resonance frequency based on a strain in the substrate caused by static pressure applied by a pressure-receiving fluid;
a first electrode that extends along a second direction perpendicular to the first direction and that outputs an excitation signal to the first resonator to excite the first resonator;
a second electrode that extends along the second direction and from which the first resonator outputs a signal having the resonance frequency; and
a processor that measures the static pressure based on the detected change of the resonance frequency, wherein
the first resonator is disposed between the first electrode and the second electrode in a third direction perpendicular to the first direction and the second direction,
the pressure-receiving fluid is interposed in a gap between the housing-fixed portion and the substrate and envelops the substrate.

2. The resonant pressure sensor according to claim 1, wherein the substrate has a cantilever structure whose support point is the substrate-fixed portion.

3. The resonant pressure sensor according to claim 1, wherein the substrate has a strain-mitigating hole that penetrates the substrate.

4. The resonant pressure sensor according to claim 1, wherein
the first resonator is made of a semiconductor material that comprises an impurity,
a concentration of the impurity is $1 \times 10^{20}$ $(cm^{-3})$ or higher, and
an atomic radius of the impurity is smaller than an atomic radius of the semiconductor material.

5. The resonant pressure sensor according to claim 1, further comprising:
a second resonator disposed in the substrate, wherein
the second resonator detects a change of a resonance frequency based on the strain in the substrate caused by the static pressure applied by the pressure-receiving fluid, and
the second resonator has a pressure sensitivity of the resonance frequency that differs from a pressure sensitivity of the resonance frequency of the first resonator.

6. The resonant pressure sensor according to claim 5, wherein
the substrate further comprises another substrate-separated portion, and
the second resonator is disposed in the another substrate-separated portion.

7. The resonant pressure sensor according to claim 5, wherein
the first resonator and the second resonator are made of a single-crystal silicon material that comprises an impurity,
a concentration of the impurity in the first resonator differs from a concentration of the impurity in the second resonator by one or more order of magnitude when a unit is made to be $(cm^{-3})$, and
the second resonator has a temperature coefficient of the resonance frequency that is greater than a temperature coefficient of the resonance frequency of the first resonator.

8. The resonant pressure sensor according to claim 5, wherein, along a thickness direction of the substrate, a thickness dimension of the second resonator is greater than a thickness dimension of the first resonator.

9. The resonant pressure sensor according to claim 1, wherein
the substrate further comprises:
   a base substrate that comprises the substrate-fixed portion and that is fixed to the housing-fixed portion; and
   a support substrate that is connected to the base substrate;
   a fixed portion that is fixed to the base substrate; and
   a separated portion that is separated from the base substrate and that extends from the fixed portion, and
the pressure-receiving fluid is interposed in a gap between the base substrate and the support substrate and envelops the separated portion.

10. The resonant pressure sensor according to claim 1, wherein
the first resonator is excited by an electrostatic force due to the excitation signal, and
a direction of the electrostatic force is along the third direction.

11. A resonant pressure sensor, comprising:
a housing;
a housing-fixed portion that is fixed to the housing;
a substrate that comprises:
   a substrate-fixed portion that is fixed to the housing-fixed portion; and
   a substrate-separated portion that is separated from the housing-fixed portion in a first direction and extends from the substrate-fixed portion in a second direction perpendicular to the first direction;
a first resonator that is disposed in the substrate-separated portion and that detects a change of a resonance frequency based on a strain in the substrate caused by static pressure applied by a pressure-receiving fluid; and
a processor that measures the static pressure based on the detected change of the resonance frequency, wherein
the pressure-receiving fluid is interposed in a gap between the housing-fixed portion and the substrate and envelops the substrate,
the first resonator has a first length along the first direction, a second length along the second direction, and a third length along a third direction perpendicular to the first direction and the second direction, and
the first length is larger than the third length and smaller than the first second length.

12. The resonant pressure sensor according to claim 11, wherein the substrate has a cantilever structure whose support point is the substrate-fixed portion.

13. The resonant pressure sensor according to claim 11, wherein the substrate has a strain-mitigating hole that penetrates the substrate.

14. The resonant pressure sensor according to claim 11, wherein
the first resonator is made of a semiconductor material that comprises an impurity, a concentration of the impurity is $1\times10^{20}$ (cm$^{-3}$) or higher, and an atomic radius of the impurity is smaller than an atomic radius of the semiconductor material.

15. The resonant pressure sensor according to claim 11, further comprising:

a second resonator disposed in the substrate, wherein the second resonator detects a change of a resonance frequency based on the strain in the substrate caused by the static pressure applied by the pressure-receiving fluid, the second resonator has a pressure sensitivity of the resonance frequency that differs from a pressure sensitivity of the resonance frequency of the first resonator, the second resonator has a fourth length along the first direction, a fifth length along the second direction, and a sixth length along the third direction, and the fourth length is larger than the sixth length and smaller than the fifth length.

16. The resonant pressure sensor according to claim 15, wherein the substrate further comprises another substrate-separated portion, and the second resonator is disposed in the another substrate-separated portion.

17. The resonant pressure sensor according to claim 15, wherein the first resonator and the second resonator are made of a single-crystal silicon material that comprises an impurity, a concentration of the impurity in the first resonator differs from a concentration of the impurity in the second resonator by one or more order of magnitude when a unit is made to be (cm$^{-3}$), and the second resonator has a temperature coefficient of the resonance frequency that is greater than a temperature coefficient of the resonance frequency of the first resonator.

18. The resonant pressure sensor according to claim 15, wherein, along a thickness direction of the substrate, a thickness dimension of the second resonator is greater than a thickness dimension of the first resonator.

19. The resonant pressure sensor according to claim 11, wherein the substrate further comprises:

a base substrate that comprises the substrate-fixed portion and that is fixed to the housing-fixed portion; and a support substrate that is connected to the base substrate;

a fixed portion that is fixed to the base substrate; and a separated portion that is separated from the base substrate and that extends from the fixed portion, and the pressure-receiving fluid is interposed in a gap between the base substrate and the support substrate and envelops the separated portion.

* * * * *

UNITED STATES PATENT AND TRADEMARK OFFICE
CERTIFICATE OF CORRECTION

PATENT NO. : 11,592,347 B2
APPLICATION NO. : 17/854209
DATED : February 28, 2023
INVENTOR(S) : Shigeto Iwai et al.

It is certified that error appears in the above-identified patent and that said Letters Patent is hereby corrected as shown below:

In the Claims

At Column 22, Claim number 11, Line number 57, "the first second length" should read -- the second length --.

Signed and Sealed this
Eighteenth Day of July, 2023

Katherine Kelly Vidal
*Director of the United States Patent and Trademark Office*